United States Patent [19]

Whitecar et al.

[11] Patent Number: 5,465,406
[45] Date of Patent: Nov. 7, 1995

[54] AUTOMATIC GAIN CONTROL OVERSHOOT LIMITER FOR AM RECEIVER

[75] Inventors: John E. Whitecar, Plymouth; Robert D. Plowdrey, Dearborn, both of Mich.

[73] Assignee: Ford Motor Company, Dearborn, Mich.

[21] Appl. No.: 300,894

[22] Filed: Sep. 6, 1994

[51] Int. Cl.⁶ .................................................. H04B 1/06
[52] U.S. Cl. ........................ 455/234.1; 455/234.2; 375/345
[58] Field of Search ........................ 375/345; 455/212, 455/213, 219, 225, 232.1, 234.1, 234.2, 235.1, 240.1, 241.1, 250.1, 334, 341, 253.2; 381/4, 7, 15, 16

[56] References Cited

U.S. PATENT DOCUMENTS

| | | | |
|---|---|---|---|
| 2,602,885 | 7/1952 | Armstrong | 455/213 |
| 3,002,088 | 9/1961 | Trevor | 375/345 |
| 3,665,321 | 5/1972 | Michnik et al. | 455/225 |
| 3,714,622 | 1/1973 | Withelmsen | |
| 3,872,387 | 3/1978 | Banach | 455/234.1 |
| 4,087,756 | 5/1978 | Rogers, jr. | 455/213 |
| 4,371,981 | 2/1983 | King et al. | 455/219 |
| 4,600,890 | 7/1986 | Horvat | |
| 4,792,992 | 12/1988 | Rinderle | |
| 4,811,423 | 3/1989 | Eastmond | |
| 4,839,905 | 6/1989 | Mantavani | 378/345 |
| 4,955,077 | 9/1990 | Sugayama | |
| 4,955,078 | 9/1990 | Chung | |
| 4,989,074 | 1/1991 | Matsumoto | 455/234.1 |
| 5,086,437 | 2/1992 | Tomita | |
| 5,175,883 | 12/1992 | Ueno | |
| 5,204,977 | 4/1993 | Feldt | |

Primary Examiner—Reinhard J. Eisenzopf
Assistant Examiner—Lisa Charouel
Attorney, Agent, or Firm—Mark L. Mollon; Roger L. May

[57] ABSTRACT

A digital radio receiver avoids overshoot or undershoot of an AGC control loop by isolating a carrier signal using an adaptive narrow bandpass filter. The carrier strength signal is used to control either a full AGC loop or an AGC overshoot limiter to avoid sudden changes in the audio output level.

11 Claims, 2 Drawing Sheets

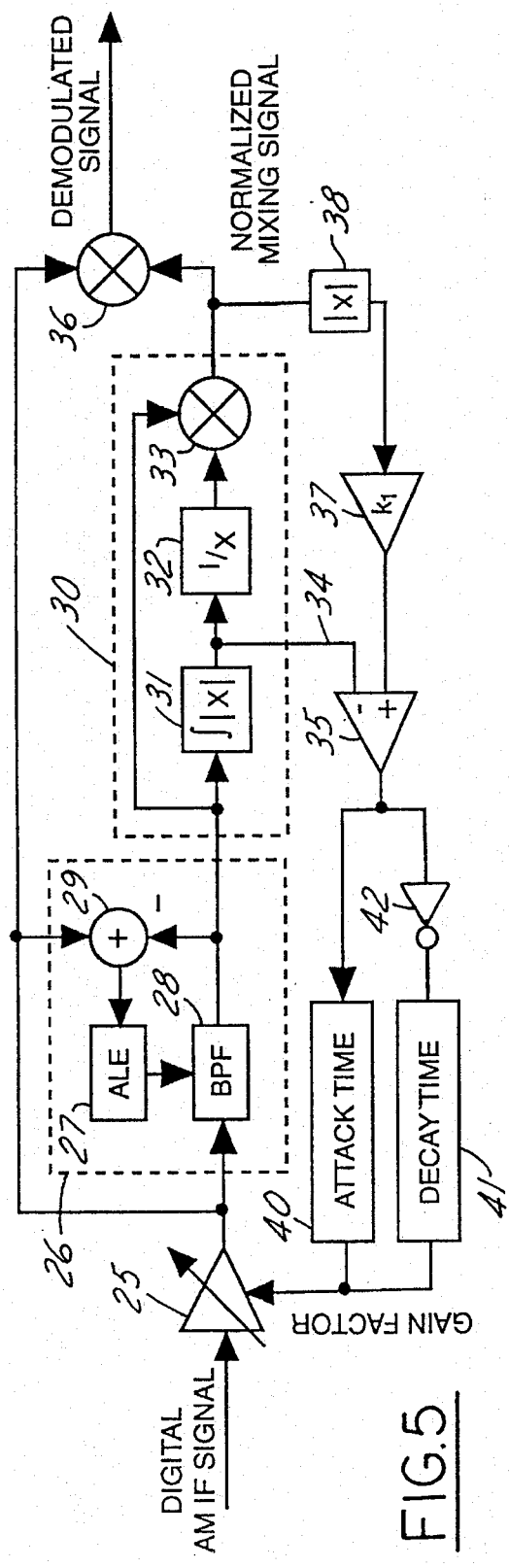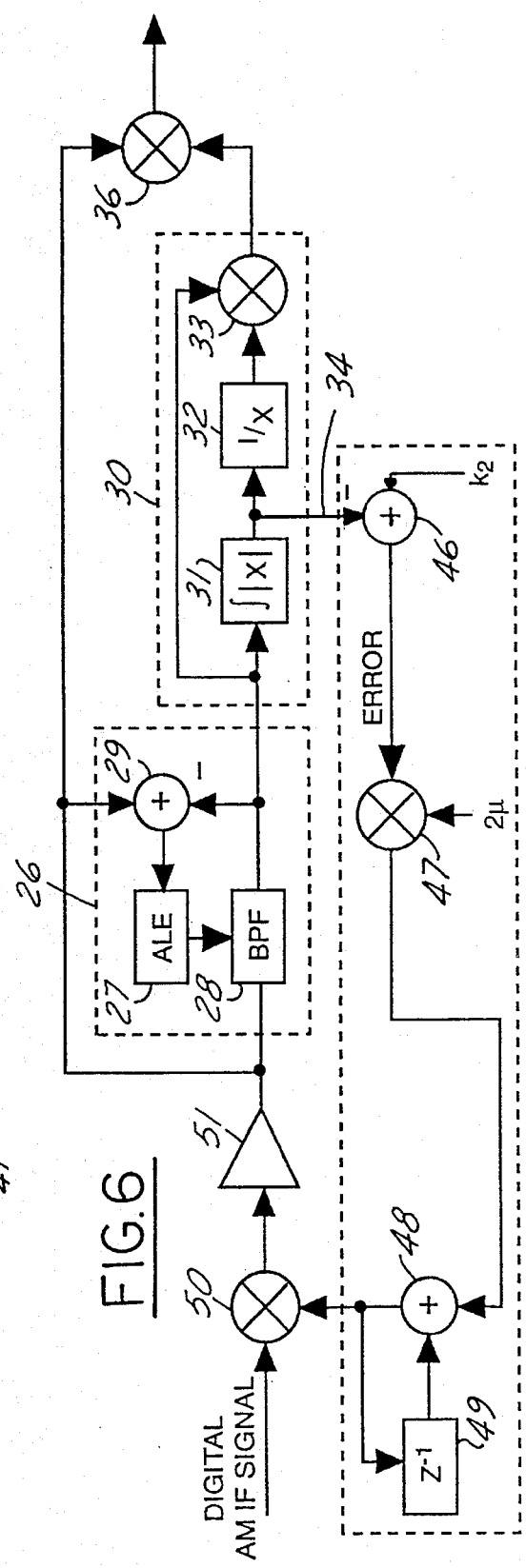

5,465,406

AUTOMATIC GAIN CONTROL OVERSHOOT LIMITER FOR AM RECEIVER

This application is related to commonly assigned application Ser. No. 07/990,143, entitled "COHERENT SIGNAL GENERATION IN DIGITAL RADIO RECEIVER", filed Dec. 14, 1992, now U.S. Pat. No. 5,354,574, which is incorporated herein by reference.

BACKGROUND OF THE INVENTION

The present invention relates in general to automatic gain control in an intermediate frequency section of an AM receiver, and more specifically to providing automatic gain control with improved response time, so as to avoid overshoot or undershoot in AGC performance.

Automatic gain control (AGC) is a well-known technique for maintaining a substantially constant average level of an amplified output signal even though the input signal level is varying. In broadcast communication receivers, automatic gain control is employed to provide a consistent audio output level despite fluctuations in signal strength of a tuned-in broadcast signal or fluctuations occurring when retuning to other broadcast signals of different power levels or distance from the receiver.

An AGC circuit controls the gain of an amplifier stage in inverse proportion to a measured average signal level downstream of the amplifier stage in the receiver. In an amplitude modulated (AM) receiver, the information signal consists of amplitude variations in a transmitted carrier signal. The information signal creates sidebands around the carrier frequency. The measured signal for determining average signal level to provide AGC control in prior art receivers has been the AM intermediate frequency (IF) signal including the carrier signal and sidebands. Therefore, AGC circuits in prior art AM receivers must be designed so that they will not respond to amplitude variations corresponding to the information signal. Typically, the AM IF signal is lowpass filtered with a long time constant to remove any audio information signal prior to an AGC control circuit. However, the lowpass filtering results in a long response time of the AGC control circuit to sudden variations in the average signal level.

Sudden variations in signal level may occur when a vehicle carrying an automotive radio receiver moves from an open environment into a tunnel or under an underpass or viaduct, for example. Although the signal strength of the AM signal may quickly decrease, the AGC control circuit responds to the change only after a delay, resulting in a decreased audio output (i.e., AGC undershoot) of the received AM station and an increase in noise during the delay. Likewise, when the vehicle reemerges from a tunnel or viaduct and the signal blockage is removed, an overamplified AM IF signal (i.e., AGC overshoot) can be produced.

These are some of the disadvantages that the present invention overcomes.

SUMMARY OF THE THE INVENTION

It is a primary advantage of the present invention that objectionable audio output level changes due to rapid changes in signal strength are avoided. A rapid response of the AGC circuit is obtained by examining the received signal strength of the carrier signal after removal of modulation sidebands. The carrier strength is compared to an adaptive level threshold to further shorten response time and ensure consistent operation.

The invention provides a method of processing an AM IF signal including a carrier signal and a modulating signal. The carrier signal is recovered from the AM IF signal substantially without modulation sidebands. The recovered carrier signal is integrated to generate a carrier strength signal. A reciprocal of the carrier strength signal is formed. The recovered carrier signal is multiplied with the reciprocal to generate a normalized mixing signal. The normalized mixing signal is mixed with the AM IF signal to recover the modulating signal. The carrier strength signal is compared with a comparison signal and the AM IF signal is modified by a gain factor in response to the comparison.

In another aspect the invention provides a radio receiver for processing an AM IF signal having a variable gain section amplifying the AM IF signal in response to a gain factor and producing a modified AM IF signal. An adaptive narrow bandpass filter receives the modified AM IF signal and produces the carrier signal substantially without modulation sidebands. An averager is coupled to the adaptive narrow bandpass filter and produces a carrier strength signal. A comparer compares the carrier strength signal with a comparison signal to determine the gain factor.

BRIEF DESCRIPTION OF THE DRAWINGS

FIG. 5 is a schematic, block diagram showing a first embodiment of the AGC limiter of the present invention.

FIG. 6 is a schematic, block diagram showing an alternative embodiment for directly providing AGC at the IF stage.

DETAILED DESCRIPTION OF THE PREFERRED EMBODIMENTS

Figure 1:
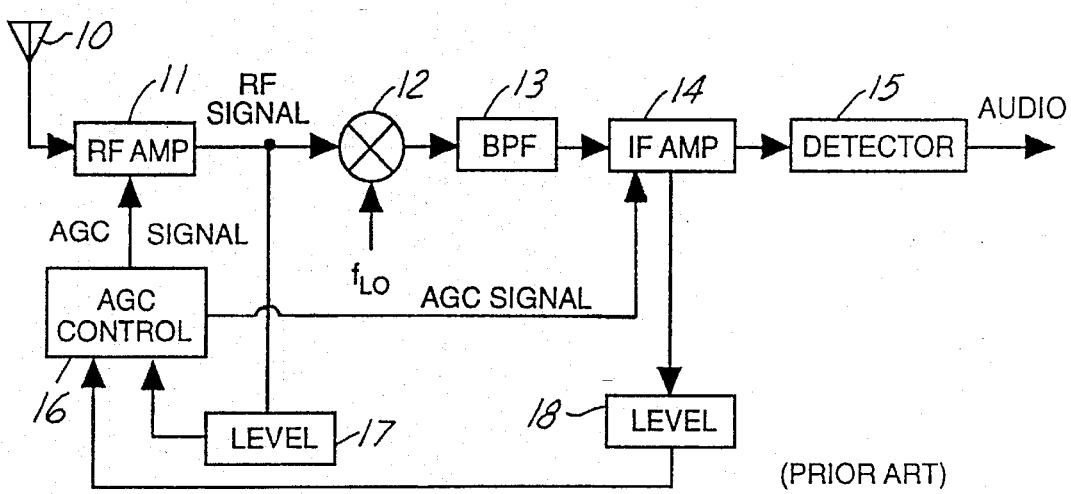
FIG. 1 illustrates a prior art radio receiver including an AGC control circuit.

In FIG. 1, a conventional receiver includes an antenna 10 connected to a radio frequency (RF) amplifier 11. An RF signal output from RF amplifier 11 is mixed in a mixer 12 with a mixing signal $f_{LO}$ from a local oscillator (not shown). The frequency of mixing signal $f_{LO}$ is selected to frequency-shift a desired RF signal output from RF amplifier 11 to the intermediate frequency (IF) of the receiver. The IF signal from mixer 12 is coupled to a bandpass filter (BPF) 13, an IF amplifier 14, and a detector 15 to demodulate the audio signal and thereby produce an audio output.

Figure 2:
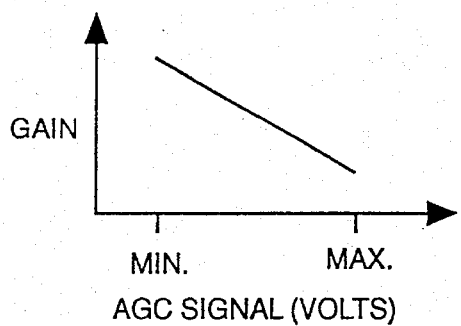
FIG. 2 plots gain versus the AGC signal.

RF amplifier 11 and IF amplifier 14 provide controllable gains in response to AGC signals from an AGC control circuit 16. AGC control 16 is connected to an RF level detector 17 and an IF level detector 18. AGC control 16 utilizes any of several known techniques to generate AGC signals responsive to the detected wideband RF and narrowband IF levels, respectively, according to AGC curves such as the one shown in FIG. 2. Thus, a decrease in signal level generates a decrease in the AGC signal and a corresponding increase in amplifier gain. Conversely, an increase in signal level results in an increased AGC signal and a decreased amplifier gain.

Figure 3:
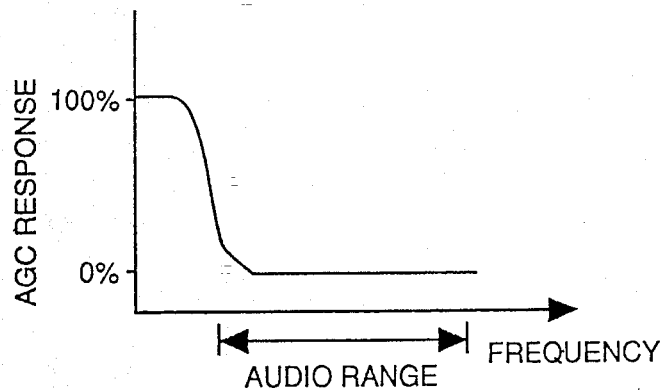
FIG. 3 plots the response of an AGC circuit corresponding to frequency.

As illustrated in FIG. 3, the prior art AGC control must not respond to amplitude changes within the audio frequency range. If it did, the modulation would be removed from the signal and no audio would be detected. Thus, the AGC control is active at frequencies below the audio range (e.g., less than about 40 hertz) and is not responsive to amplitude changes occurring above the lower end of the audio frequency range.

Figure 4:
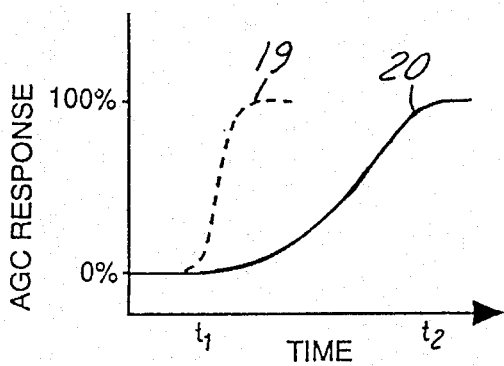
FIG. 4 plots response of an AGC circuit according to time.

Consequently, the response time of the prior art AGC control circuit is as shown in FIG. 4. In response to a sudden change in the received signal strength (such as would occur when entering or leaving a tunnel), there is 0% response in the AGC circuit for a delay time $t_1$. After a further time $t_2$, the AGC response has reached 100% of its final value and the signal level is again under control. Dashed line 19 shows the actual increase in received signal strength. Line 20 shows the actual AGC response of a prior art receiver. The gap between lines 19 and 20 corresponds to an overshoot or undershoot of the AGC response during which an over or under amplified audio signal is produced. During over or under amplification, noise, radio hiss, or a sudden increase in audio output may occur.

FIG. 5 shows a circuit of the present invention for avoiding the foregoing problems of the prior art by inspecting the received signal strength of the carrier signal without modulation sidebands. Due to the type of signal processing required by the present invention, a digital radio receiver employing digital signal processing (DSP) techniques is preferred. A typical receiver may employ an analog RF and IF sections for deriving the intermediate frequency signal which is then digitized to provide a digital IF signal.

A digital AM IF signal is provided to a variable gain amplifier 25. A gain modified IF signal is provided from amplifier 25 to an adaptive narrow bandpass filter 26 including an adaptive line enhancer (ALE) 27 a bandpass filter (BPF) 28 and a summing junction 29. Adaptive filter 26 operates in the manner described in U.S. Pat. No. 5,357,574. Thus, ALE 27 determines the appropriate center frequency for BPF 28. When locked to an incoming IF signal, the bandwidth of BPF 28 is in the range of 20 to 30 hertz, thereby eliminating modulation sidebands so that the output of BPF 28 is comprised of the carrier signal substantially without modulation.

The carrier signal is coupled to a normalizer 30 including an integrator or averager 31, a reciprocal block 32 and a multiplier 33. Integrator 31 provides a long-term integration of the absolute value of the carrier signal thereby providing a carrier strength signal on a line 34 to the inverting input of a comparator 35. The reciprocal of the carrier strength is obtained in reciprocal block 32 and is provided to one input of multiplier 33. The reciprocal is multiplied by the carrier signal in order to provide a normalized mixing signal, i.e., a carrier signal which varies between +1 and −1. The normalized mixing signal is mixed with the gain modified AM IF signal in a mixer 36 to generate a demodulated AM signal. The use of a normalized mixing signal maximizes the signal-to-noise ratio of the demodulated signal. Furthermore, the use of a constant amplitude, normalized mixing signal avoids erroneous modulation added into the demodulated signal which would otherwise create noise.

The normalized mixing signal is rectified in an absolute value block 38 and then multiplied by a constant $k_1$ in an amplifier 37. Constant $k_1$ is less than 1 so that a proportion of the normalized mixing is provided to the non-inverting input of comparator 35. The output of comparator 35 is connected to an attack-time block 40 and a decay-time block 41 through an inverter 42.

The gain factor of variable amplifier 25 is typically unity. The gain factor is reduced in response to sudden increases in the AM IF signal by attack-time block 40 and delay-time block 41 as follows. The instantaneous value of the normalized mixing signal is attenuated by constant $k_1$ in amplifier 37. The instantaneous value of the attenuated signal is compared to the average of the carrier signal in comparator 35. The value of constant $k_1$ is selected to insure that the instantaneous value is less than the average value during normal conditions when the carrier strength is not varying by large amounts. When there is a jump in carrier strength, the instantaneous value will exceed the average value which is slower to respond to the increase and thereby trip the output of comparator 35 from a low to a high value. The output from comparator 5 initiates attack-time block 40 which reduces the gain factor applied to amplifier 25 very quickly to restore the IF signal magnitude to its proper value. When the instantaneous attenuated mixing signal then drops below the average, the output of comparator 35 is restored to a low level thereby deactivating attack-time block 40 and activating decay-time block 41 through the inverted signal from inverter 42. The decay-time block 41 slowly restores the gain factor to a value of 1 and the circuit will assume its rest state until the next sudden increase in the IF signal.

Since the threshold for comparator 35 is comprised of the moving average provided by integrator 31, the AGC control automatically compensates for temperature variations and other conditions. Attenuation constant $k_1$ insures that the comparator will not trigger from amplitude changes in the normalized mixing signal that are not at least 20% greater than the moving average. For example, constant $k_1$ can be derived as an attenuation factor equal to 80% of the peak-to-average ratio of the nominal coherent mixing signal.

FIG. 6 shows an alternative embodiment of the present invention for providing full AGC control of the digital AM IF signal and elimination of both overshoot and undershoot. A short-term average carrier strength signal is calculated in integrator 31 and is provided over signal line 34 to a least-mean-squared (LMS) block 45. Specifically, the average carrier strength signal is input to a difference block 46 along with a constant $k_2$ corresponding to the desired average carrier strength. The difference at these inputs produces an error signal coupled to one input of a multiplier 47. A constant $2\mu$ defining the size of the error band of the LMS block is coupled to a second input of multiplier 47. The output of multiplier 47 is coupled to one input of a summer 48. The output of summer 48 is coupled to the remaining input of summer 48 through a unit delay block 49. The output of summer 48 is also coupled to one input of a multiplier 50. A second input of multiplier 50 receives the digital AM IF signal. The output of multiplier 50 is coupled to the input of a shift register 51 for providing a fixed gain (e.g., 24 dB) in order to obtain an acceptable dynamic range of AGC control.

In operation, LMS block 45 tends to maintain the value of the average carrier strength at a value determined by constant $k_2$. Since the AGC control circuit shown in FIG. 6 is not responsive to modulation of the information signal, the speed at which the AGC control operates can be very fast without affecting the information signal.

What is claimed is:

1. A method of processing an AM IF signal including a carrier signal and a modulating signal, said method comprising the steps of:

recovering said carrier signal from said AM IF signal substantially without modulation sidebands;

integrating said recovered carrier signal to generate a carrier strength signal;

forming a reciprocal of said carrier strength signal;

multiplying said recovered carrier signal and said reciprocal to generate a normalized mixing signal;

mixing said normalized mixing signal and said AM IF signal to recover said modulating signal;

comparing said carrier strength signal with a comparison signal; and modifying said AM IF signal by a gain factor in response to said comparison.

2. The method of claim 1 wherein said carrier signal is recovered using an adaptive narrowband filter substantially eliminating the modulation sidebands at frequencies greater than about 20 Hertz.

3. The method of claim 1 wherein said comparison signal is proportional to said normalized mixing signal.

4. The method of claim 3 further comprising the step of reducing said gain factor when said comparison signal exceeds said carrier strength signal, according to a predetermined attack time.

5. The method of claim 4 further comprising the step of increasing said gain factor when said comparison signal falls below said carrier strength signal, according to a predetermined decay time.

6. The method of claim 1 wherein said comparison signal is comprised of a predetermined constant.

7. The method of claim 6 wherein said gain factor for modifying said AM IF signal is selected to minimize a difference between said carrier strength signal and said predetermined constant.

8. A radio receiver processing an AM IF signal including a carrier signal and a modulating signal, comprising:

a variable gain section amplifying said AM IF signal in response to a gain factor, for producing a modified AM IF signal;

an adaptive narrow bandpass filter receiving said modified AM IF signal, for producing said carrier signal substantially without modulation sidebands;

an averager coupled to said adaptive narrow bandpass filter receiving said carrier signal for producing a carrier strength signal; and a comparer comparing said carrier strength signal with a comparison signal to determine said gain factor.

9. The receiver of claim 8 further comprising a least-mean-square (LMS) controller for controlling said gain factor so as to maintain said carrier strength signal at a predetermined value.

10. The receiver of claim 8 further comprising a normalizer coupled to said averager for producing a normalized mixing signal by multiplying said carrier signal by the reciprocal of said carrier strength signal.

11. The receiver of claim 10 wherein said comparison signal is proportional to said normalized mixing signal.

\* \* \* \* \*